(12) United States Patent
Monda et al.

(10) Patent No.: US 9,706,666 B2
(45) Date of Patent: Jul. 11, 2017

(54) ELECTRONIC DEVICE

(75) Inventors: Tomoko Monda, Kawasaki (JP); Minoru Mukai, Tokyo (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 1019 days.

(21) Appl. No.: 13/422,499

(22) Filed: Mar. 16, 2012

(65) Prior Publication Data

US 2012/0209537 A1 Aug. 16, 2012

Related U.S. Application Data

(63) Continuation of application No. PCT/JP2009/066301, filed on Sep. 17, 2009.

(51) Int. Cl.
*H05K 3/22* (2006.01)
*H05K 3/34* (2006.01)
*H05K 1/02* (2006.01)
*G01R 31/04* (2006.01)

(52) U.S. Cl.
CPC ........... *H05K 3/341* (2013.01); *G01R 31/048* (2013.01); *H05K 1/0268* (2013.01); *H05K 3/225* (2013.01); *H05K 2201/0979* (2013.01); *H05K 2203/0271* (2013.01); *Y02P 70/613* (2015.11)

(58) Field of Classification Search
CPC .................................................... G01R 31/048
USPC ........................................................... 702/34
See application file for complete search history.

(56) References Cited

U.S. PATENT DOCUMENTS

| 5,239,487 A | * | 8/1993 | Horejsi et al. ............... 702/184 |
| 2003/0214047 A1 | * | 11/2003 | Noguchi ...................... 257/774 |
| 2008/0249743 A1 | * | 10/2008 | Hirohata et al. ............. 702/181 |
| 2009/0058435 A1 | * | 3/2009 | Nakamura .................... 324/719 |
| 2009/0227136 A1 | * | 9/2009 | Tokii ............................. 439/345 |
| 2009/0289098 A1 | * | 11/2009 | Terada ................... H01L 24/75 |
| | | | 228/102 |

(Continued)

FOREIGN PATENT DOCUMENTS

| JP | 6-011436 A | 1/1994 |
| JP | 7-142534 A | 6/1995 |

(Continued)

OTHER PUBLICATIONS

English Translation of IPRP dated Apr. 19, 2012 from PCT/JP2009/066301; 5 pages.

(Continued)

*Primary Examiner* — Gregory J Toatley
*Assistant Examiner* — Michael Dalbo
(74) *Attorney, Agent, or Firm* — Ohlandt, Greeley, Ruggiero & Perle, L.L.P.

(57) ABSTRACT

According to one embodiment, an electronic device includes a circuit board with an electronic component mounted thereon. The device, includes a measuring unit, a first database, a determination unit, and a presentation unit. The measuring unit measures an value of state of the electronic component. The first database stores data indicating correlation. The determination unit determines one of ways of applying a load to a junction, based on the value of state of the electronic component measured by the measuring unit, and referring to the first database. The presentation unit presents the determined way of applying the load to the junction.

10 Claims, 18 Drawing Sheets

(56) References Cited

U.S. PATENT DOCUMENTS

2010/0083030 A1* 4/2010 Thayer .............................. 714/3
2010/0306577 A1* 12/2010 Dreifus et al. .................... 714/6

FOREIGN PATENT DOCUMENTS

| JP | 2856193 B2 | 2/1999 |
| JP | 2000-323833 A | 11/2000 |
| JP | 2000-332407 A | 11/2000 |
| JP | 2007-035891 A | 2/2007 |

OTHER PUBLICATIONS

International Search Report dated Oct. 27, 2009 from PCT/JP2009/066301.

* cited by examiner

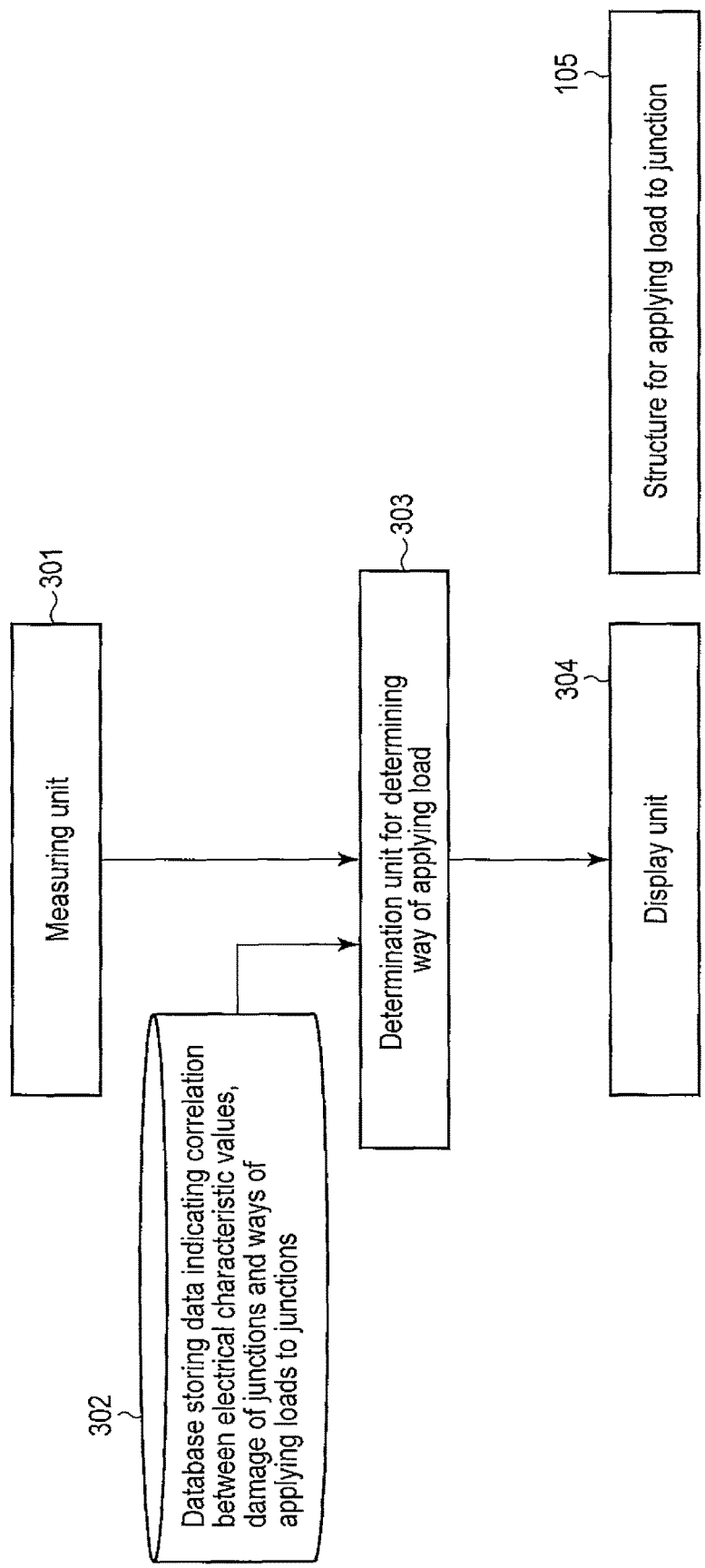
F I G. 3

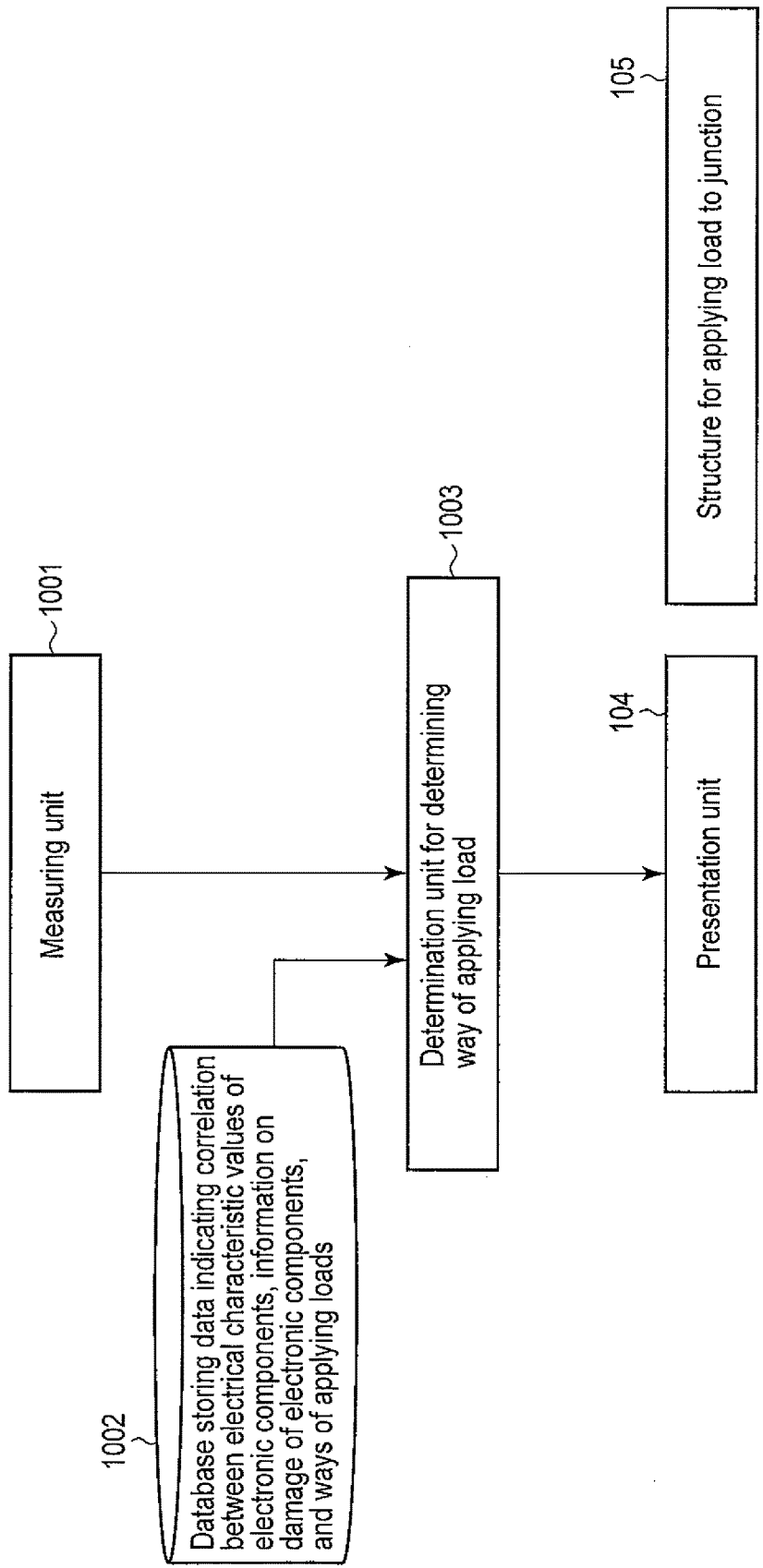
F I G. 10

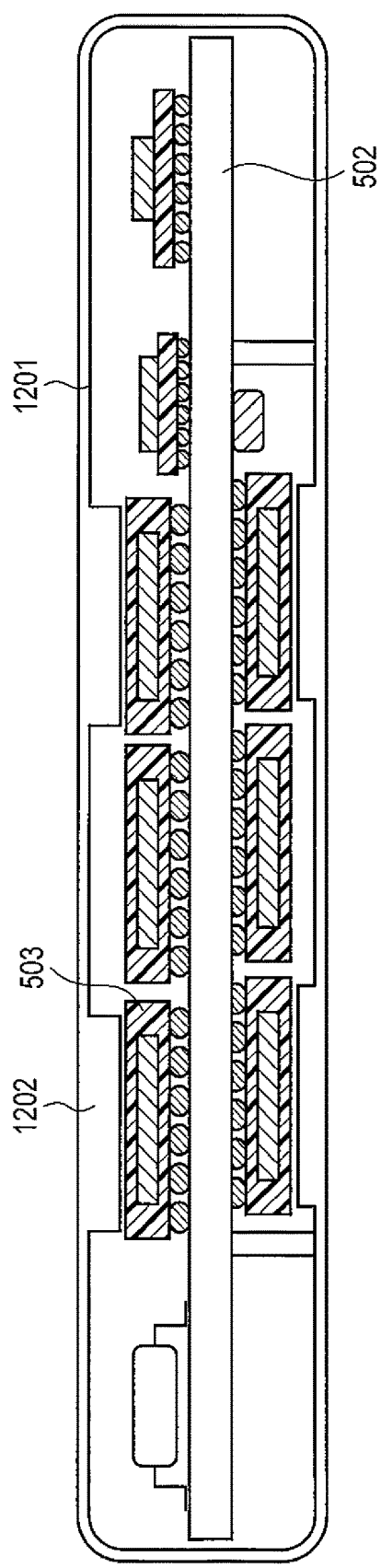
F I G. 12

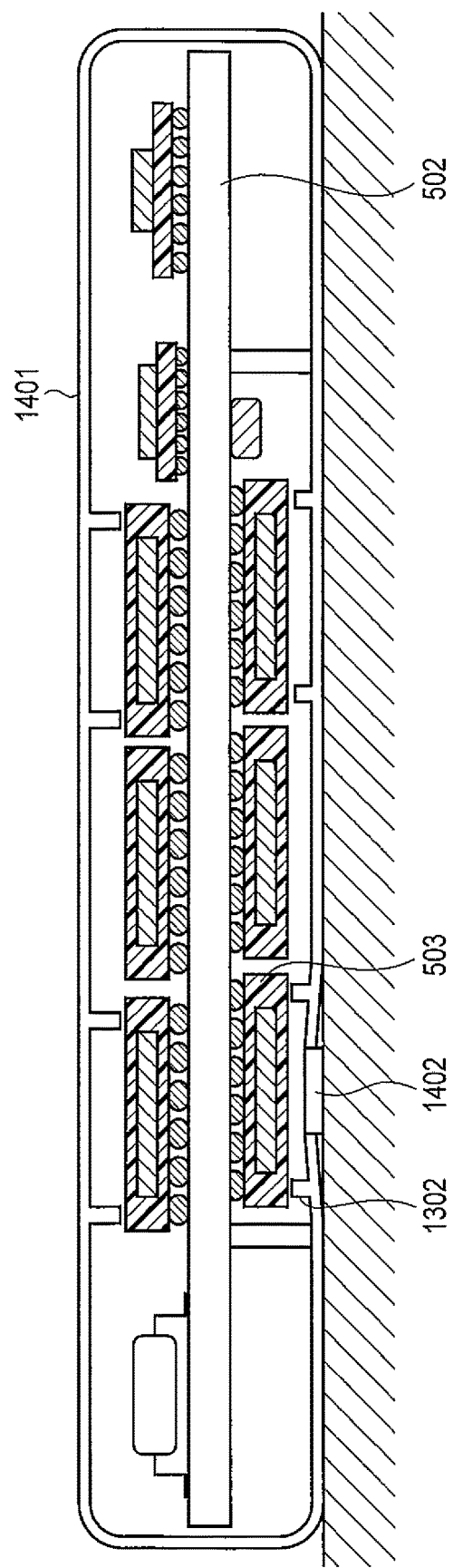
F I G. 14

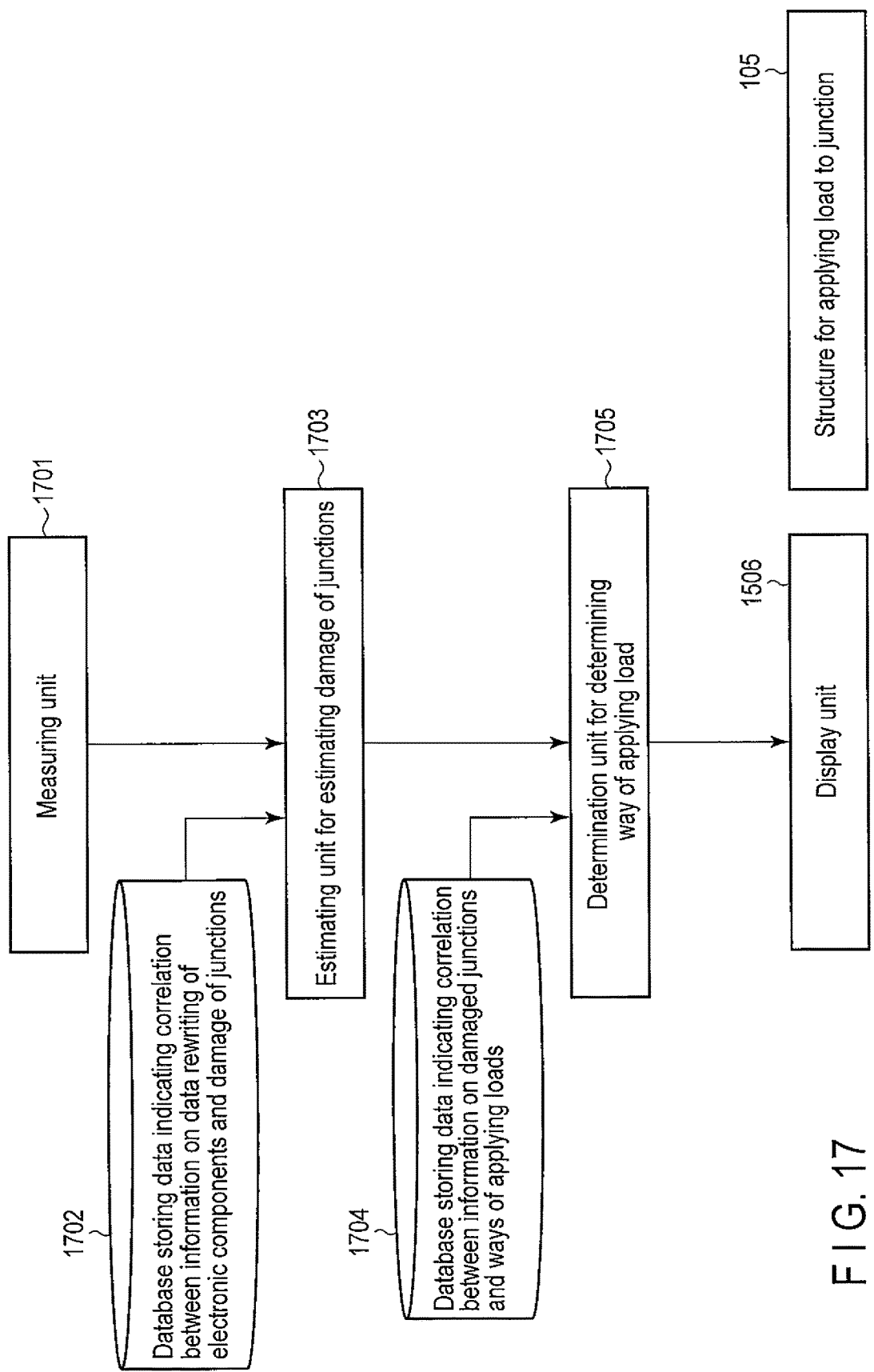
F I G. 17

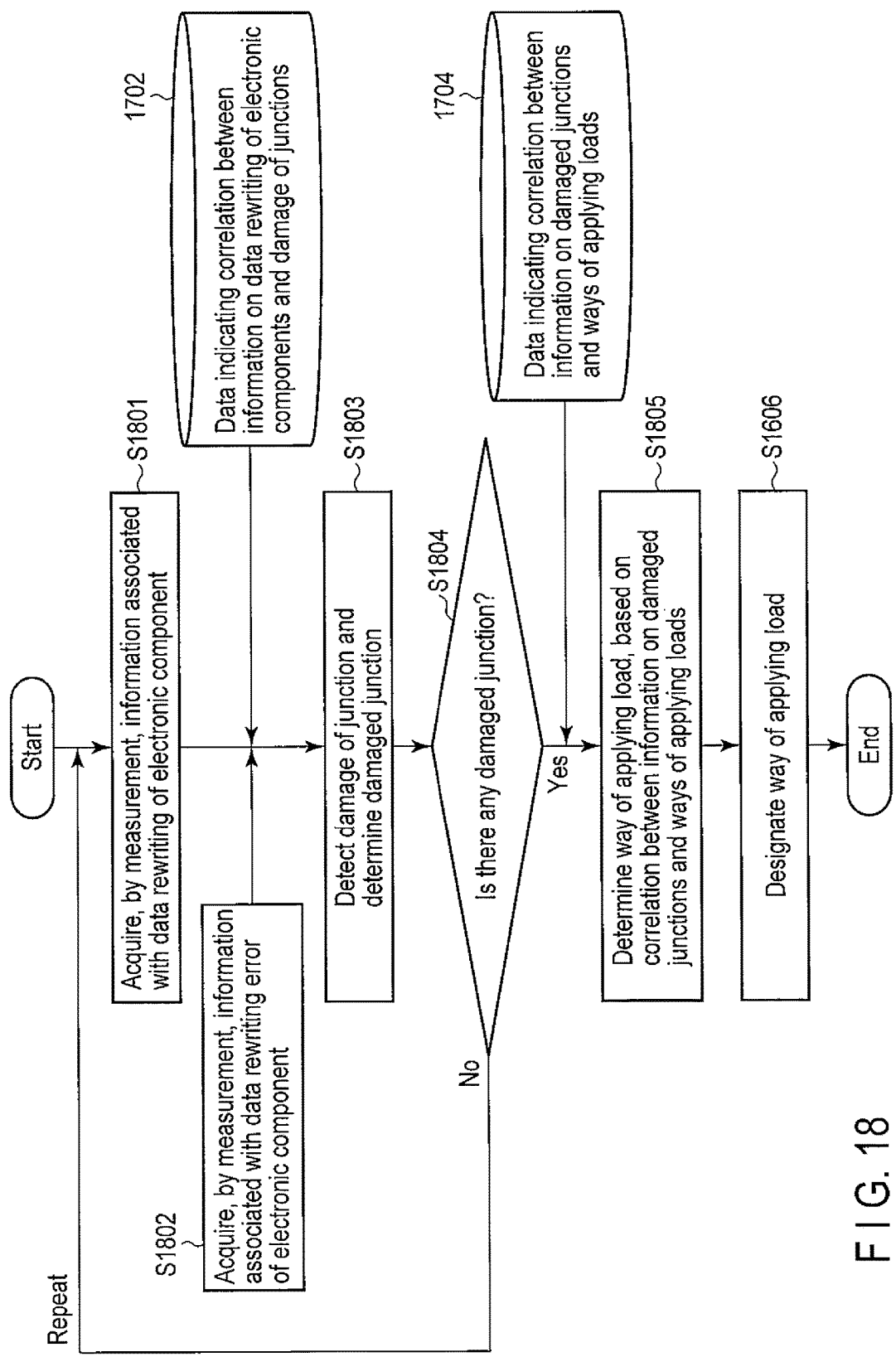
F I G. 18

ELECTRONIC DEVICE

CROSS REFERENCE TO RELATED APPLICATIONS

This application is a Continuation Application of PCT Application No. PCT/J22009/066301, filed Sep. 17, 2009, the entire contents of which are incorporated herein by reference.

FIELD

Embodiments described herein relate generally to an electronic device with an electronic component, and more particularly, to an electronic device for restoring electrical connection of an electronic component with a circuit board when damage or disconnection of the conjunction of the component is detected.

BACKGROUND

Recently, there is a demand for realizing high functionality or multi-functionality of an electronic device provided with a semiconductor package including semiconductor chips, or with a plurality of electronic components as chip-configuration passive components (hereinafter, chip components), such as resistors and capacitors. To respond to this demand, the number of electrical junctions, such as solder bumps for connecting a semiconductor package to a circuit board, significantly increases. In contrast, there is a tendency to reduce the sizes of the electrical junctions. As a result, such a problem occurs as in which the junctions are often damaged by temperature variations repeatedly occurring in semiconductor packages, bending, impact, vibration, etc. If tension stress occurs in the damaged junctions, the junctions assume an open state, i.e., are degraded in electrical connection, thereby degrading data writing and reading performance. At the worst, stored valuable electronic data will be unreadable.

To overcome the above problem, there is a structure that exhibits a highly reliable heat radiation effect utilizing a metal radiator provided on a semiconductor element, and prevents occurrence of tension stress by fixing a spacer to give an appropriate pressing force to the junction (see, for example, JP-B No. 2856193).

In the technique of this JP-B No. 2856193, it is difficult to fix the spacer in consideration of individual difference, position and/or deformation during use, in order that it will apply appropriate pressing force in the initial state, with the result that it is possible that the pressing force of the space is excessive or insufficient. Further, even if the spacer presses the junction in the initial state, the compressed state may disappear due to a change in the shape of the junction during use. Furthermore, when a load is applied just above the center portion of a chip, tension stress may occur in a junction that is positioned at the outer portion of the chip. Because of these, in the technique of the patent document, electrical connection may not be restored.

BRIEF DESCRIPTION OF THE DRAWINGS

FIG. 3 is a block diagram illustrating an electronic device according to a first embodiment;

FIG. 10 is a block diagram illustrating an electronic device according to a second embodiment;

FIG. 12 is a sectional view useful in explaining an example of a loading structure employed in the structure of FIG. 11;

FIG. 14 is a sectional view useful in explaining an example of a loading structure according to a second modification of the second embodiment;

FIG. 17 is a block diagram illustrating an electronic device according to a fourth embodiment; and FIG. 18 is a flowchart useful in explaining an operation example of the electronic device shown in FIG. 17.

DETAILED DESCRIPTION

Referring to the accompanying drawings, electronic devices according to embodiments and modifications will be described in detail. In the embodiment and modification, like reference numbers denote like elements, and duplicate explanation will be avoided.

In general, according to one embodiment, an electronic device includes a circuit board with an electronic component mounted thereon. The device includes a measuring unit, a first database, a determination unit, and a presentation unit. The measuring unit measures a value of state of the electronic component. The first database stores data indicating correlation between the value of state of the electronic component, information associated with a state of a junction of the electronic component and the circuit board, and ways of applying a load to the junction to compress the junction between the electronic component and the circuit board. The determination unit determines one of ways of applying the load to the junction, based on the value of state of the electronic component measured by the measuring unit, and referring to the first database. The presentation unit presents the determined way of applying the load to the junction.

In the electronic device of the embodiments, if a damaged junction is detected in an electronic component, electrical connection of the junction can be restored to a state in which electronic data stored in the electronic device can be read therefrom and/or electronic data can be written to the electronic device.

In the electronic devices of the embodiments, a load (e.g., a pressing load) is applied to the junction of an electronic component that is free from load in the initial state and has been detected to be damaged during use, thereby restoring electrical connection to shift a state in which reading and/or writing of electronic data is disabled, to a state in which reading and/or writing of electronic data is enabled. The electronic devices will be described in detail.

Figure 1:
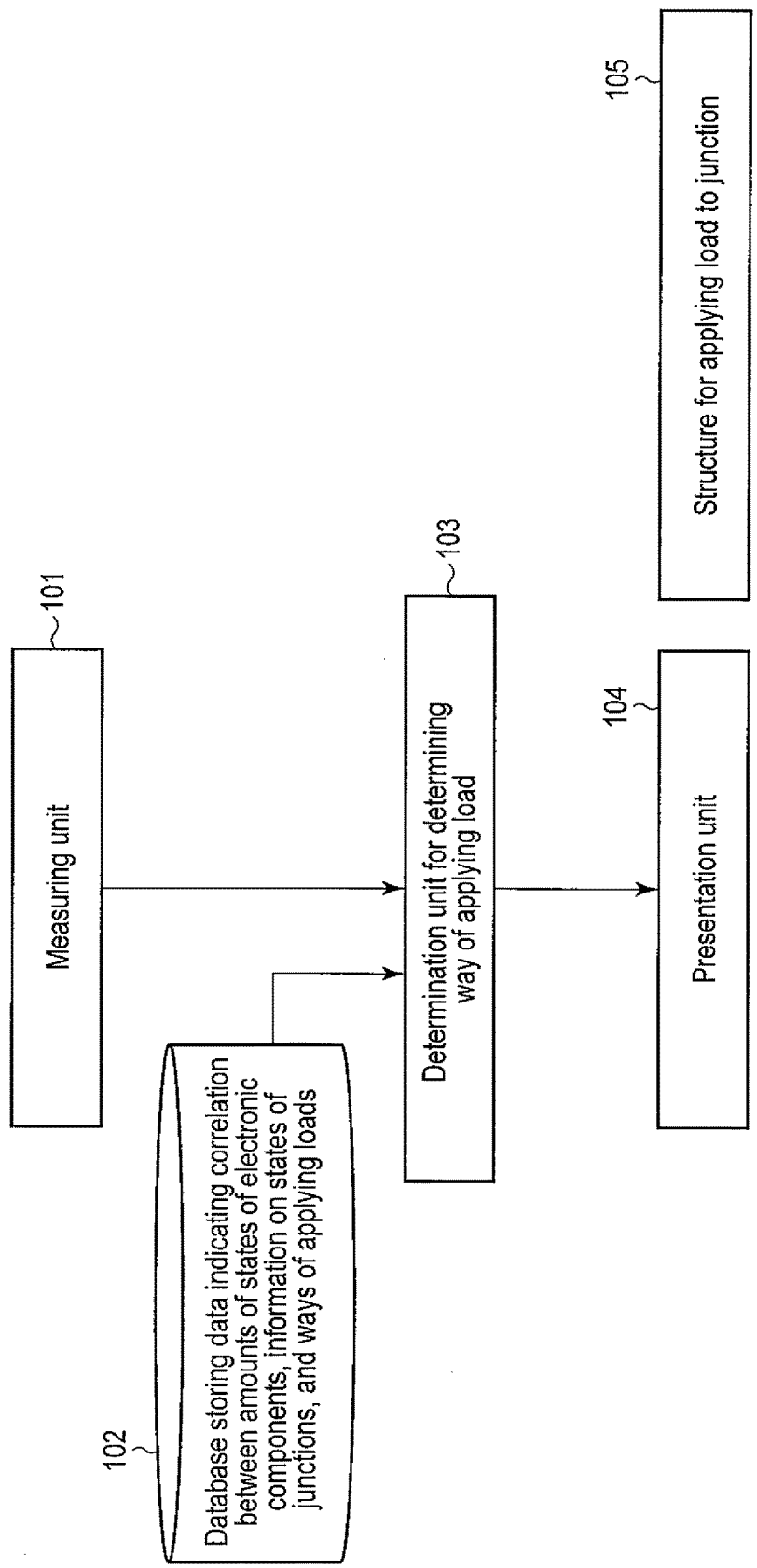
FIG. 1 is a block diagram illustrating an electronic device according to embodiments.

Referring first to FIG. 1, the basic structure of electronic devices according to the embodiments will be described. Each of the electronic devices can be built in a system, or can be located outside the system and connected thereto.

Each of the electronic devices comprises a measuring unit 101, a database 102, a determination unit 103, a presentation unit 104 and a loading structure (or loading structures) 105.

The measuring unit 101 measures the value of at least one state of an electronic component. The values of states are, for example, electrical characteristic values (e.g., an electrical resistance value, a current value and/or a voltage value), physical amounts (e.g., temperature, strain, stress and/or acceleration) associated with the electronic component (or a board or a casing as an equivalent), and information associated with data rewriting. The measuring unit 101 measures the value of state of each electronic component, or that of each junction of each electronic component. The measuring unit 101 may measure the value of at least one state of only a particular junction included in the junctions of each electronic component.

The database 102 stores data indicating the correlation between the values of states of electronic components and the states of the junctions of the electronic components, and also stores data indicating the correlation between the information associated with loads on the junctions and the ways of applying the loads to the junctions. Instead of the ways of applying loads, or in addition to the ways, the database 102 may store data indicating the ways of dripping or injecting an adhesive or a resin (e.g., epoxy resin) to the position of each junction in accordance with the state thereof. As the adhesive, a hardening and contracting material may be used. If the adhesive or resin is used instead of employing the ways of applying loads, the loading structure 105 for applying a load to a junction is not necessary. In the descriptions below, it is assumed that the "ways of applying loads" include "injection or dripping of an adhesive or a resin to the position of a junction," instead of or in addition to the load applying ways.

In the first and second embodiments described below, all databases including the database 102 store threshold values set for the respective positions in each electronic component measured by the measuring unit. A plurality of threshold values may be set for a plurality of positions corresponding to one electronic component, or one threshold value may be set for one electronic component. In the second embodiment, one threshold value is set for one electronic component. In the second embodiment, the database 102 also stores data concerning first positions at which the measuring unit performs measurement, and second positions at which loads are applied, the first and second positions being associated with each other. The determination unit 103 determines that a junction is damaged, if the electrical characteristic value (e.g., electrical resistance value) of the junction is not less than a threshold value (in the case where the electrical characteristic value is a current value, if it is not more than a threshold value), thereby applying a load to the second position(s) corresponding to the measured (i.e., first) position(s). In the third embodiment described below, the database stores data indicating the correlation between the physical amounts associated with the electronic components and measured by the measuring unit, and the index values associated with the damage of the junctions of the electronic components, and also stores data indicating the correlation between the index values and the ways of applying loads. Further, in the fourth embodiment described below, the database stores, for each electronic component, data indicating the correlation between the information (e.g., the number of times of rewriting) associated with data reading and/or data rewriting by data writing, and damage of the junctions, and also stores data indicating the correlation between the damage and the ways of applying loads to the junctions.

Using the database 102, the determination unit 103 determines a way of applying loads based on the value of state of an electronic component. The information associated with the state of a junction is, for example, information indicating whether the junction is damaged, or an index value indicating to what extent the junction is damaged.

The presentation unit 104 presents ways of applying loads. For instance, the presentation unit 104 displays them on a screen, using characters.

The loading structure 105 is a structure for applying a load to a junction. A plurality of loading structures may be employed for respective junctions. Alternatively, loading structures 105 may be employed only for positions in an electronic component, at which the risk of damage is high. When the electronic component is rectangular, four loading structures 105, for example, may be provided at the respective junctions positioned at the four corners of the electronic component.

Figure 2:
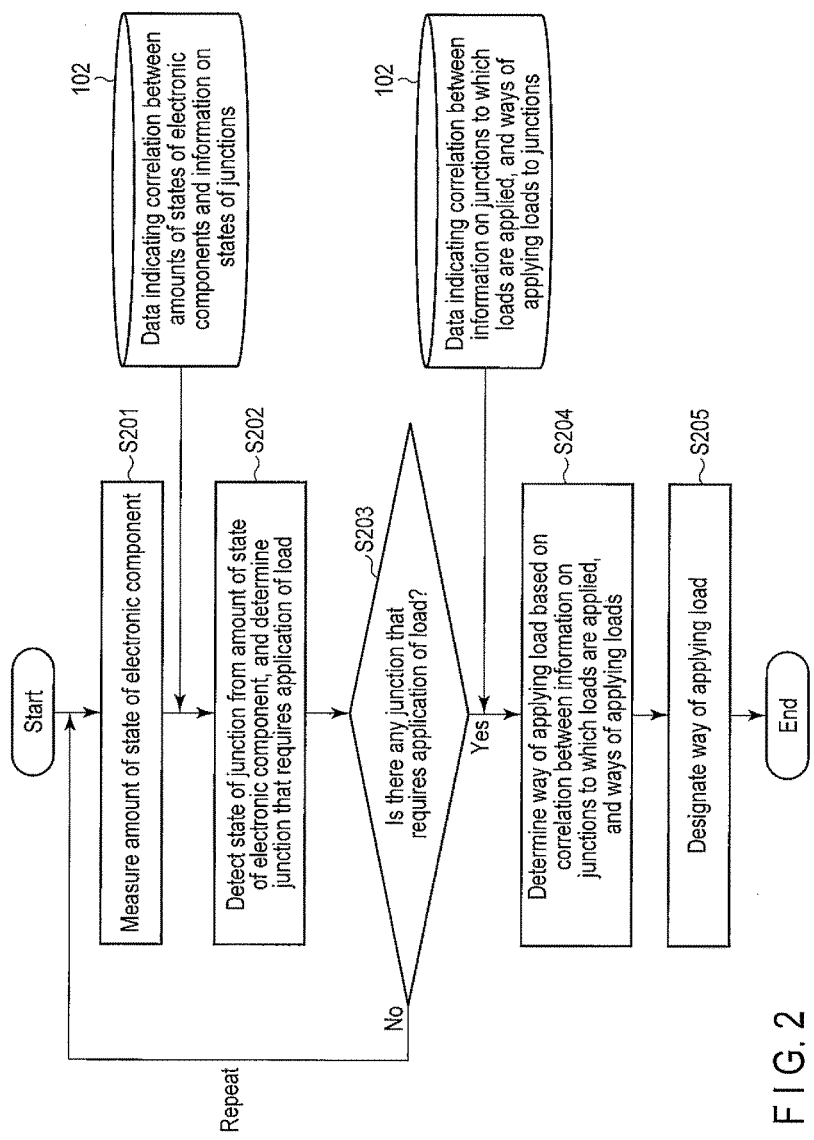
FIG. 2 is a flowchart useful in explaining an operation example of the electronic device of FIG. 1.

Referring then to FIG. 2, a description will be given of an operation example of the electronic device shown in FIG. 1.

The measuring unit 101 measures the value of state of an electronic component (step S201). Referring to the database 102 that stores data indicating the correlation between the values of states of the electronic components and the information associated with the states of the junctions, the determination unit 103 detects the junction(s) to which a load must be applied, based on the measured value of state of the electronic component (step S202). The determination unit 103 determines whether a load needs to be applied each of the junctions (203). If there is a junction to which a load must be applied, the determination unit 103 refers to the database that stores data indicating the correlation between the information for applying loads and the ways of applying the loads, thereby determining an appropriate one of the ways (step S204). After that, the determination unit 103 informs the loading structure of the determined way (step S205).

First Embodiment

In a first embodiment, the electrical characteristic value of an electronic component, for example, is set as the value of state of the electronic component, and information associated with the state of a junction is set to indicate damage of the junction.

Referring to FIG. 3, the electronic device of the first embodiment will be described.

An electronic device according to the first embodiment comprises a measuring unit 301, a database 302, a determination unit 303, a display unit 304 and a loading structure (or loading structures) 105.

The measuring unit 301 measures an electrical characteristic value of an electronic component. The other operations of the measuring unit 301 are similar to those of the measuring unit 101.

The database 302 stores data indicating the correlation between electrical characteristic values, states of damage of junctions, and ways of applying loads to the junctions. More specifically, the database 302 stores data for detecting damage of electronic components based on the electrical characteristics of the electronic components, data associated with ways of applying loads to junctions when the junctions are detected to be damaged, and data for associating the information concerning the detected damage of the junctions with the ways of applying the loads. Assuming, for example, that the database 302 holds variations in electrical resistance values for detecting damage of the junctions, the determination unit 303 can detect that a junction has been damaged, if the electrical resistance of the junction becomes infinite or becomes significantly large. Further, the database 302 holds, as data associated with ways of applying loads to the junctions, data associated with the positions at which loads are applied, and means for applying the loads. Example of ways of applying loads will be described later with reference to FIGS. 5, 8, 9 and 12 to 14.

The determination unit 303 refers to the database 302 to detect whether each junction is damaged, based on the electrical characteristic thereof, thereby determining a junction(s) to which a load needs to be applied, and also determining which way of applying loads should be used for the junction that needs load application.

The display unit 304 presents, to a user, the way of applying loads determined by the determination unit 303. For instance, the display unit 304, for example, displays the way of applying the load on its screen for the user.

Figure 4:
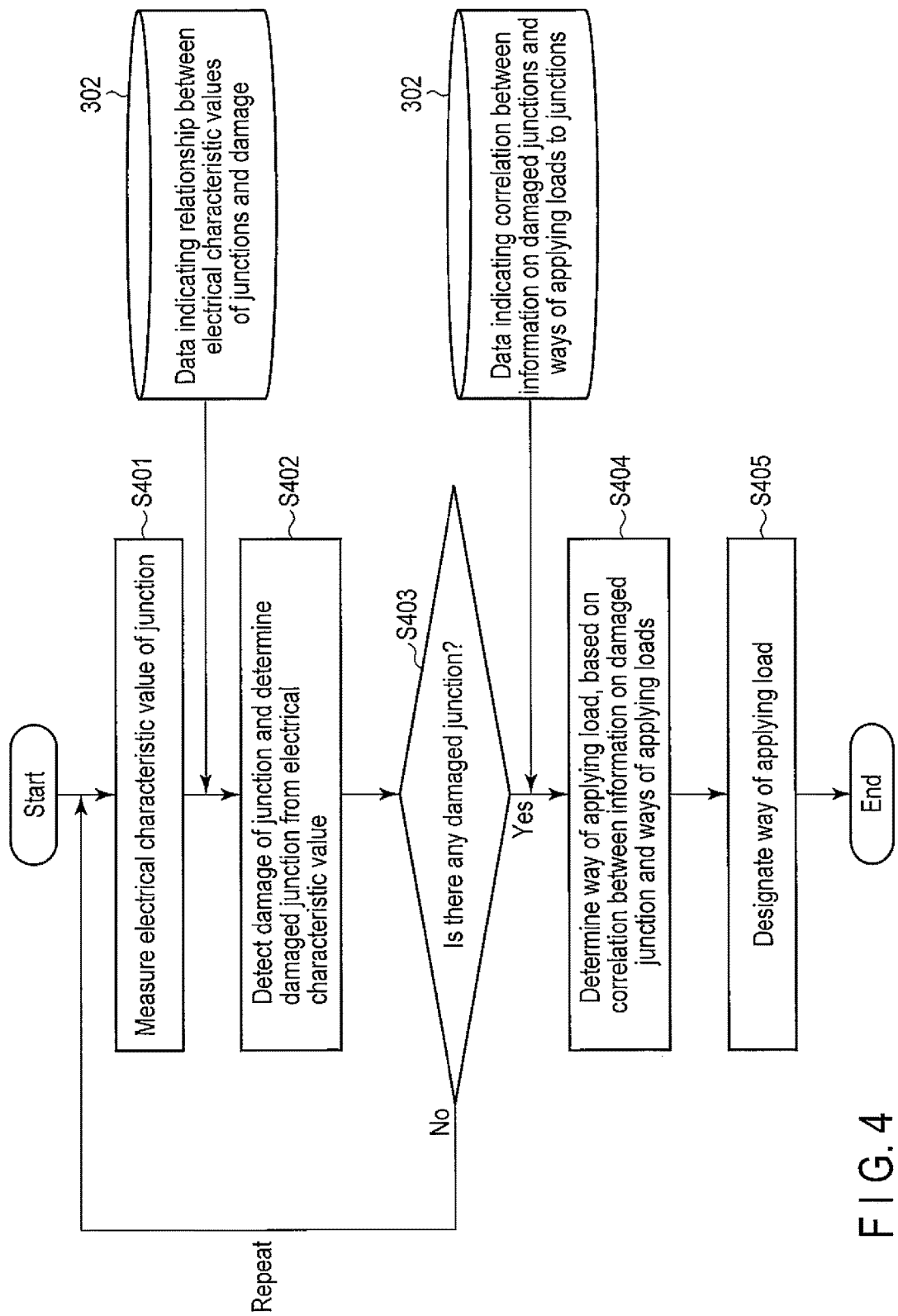
FIG. 4 is a flowchart useful in explaining an operation example of the electronic device of FIG. 3.

Referring then to the flowchart of FIG. 4, a description will be given of an operation example of the electronic device shown in FIG. 3.

The measuring unit 301 measures the electrical characteristic value of each junction (step S401). Based on the measured electrical characteristic value, the determination unit 303 detects a damaged junction with reference to the database 302 that holds correlation data for providing the electrical characteristic values and the loads (step S402). The determination unit 303 determines whether there is a damaged junction (step S403). If it is determined that there is a damaged junction, the determination unit 303 refers to the database 302 that stores data indicating the correlation between the information on damaged junctions and the ways of applying loads to the junctions, thereby determining an appropriate one of the ways, based on the information on the damaged junctions (step S404). After that, the determination unit 303 instructs the display unit 304 to display the determined way (step S405).

Figure 5:
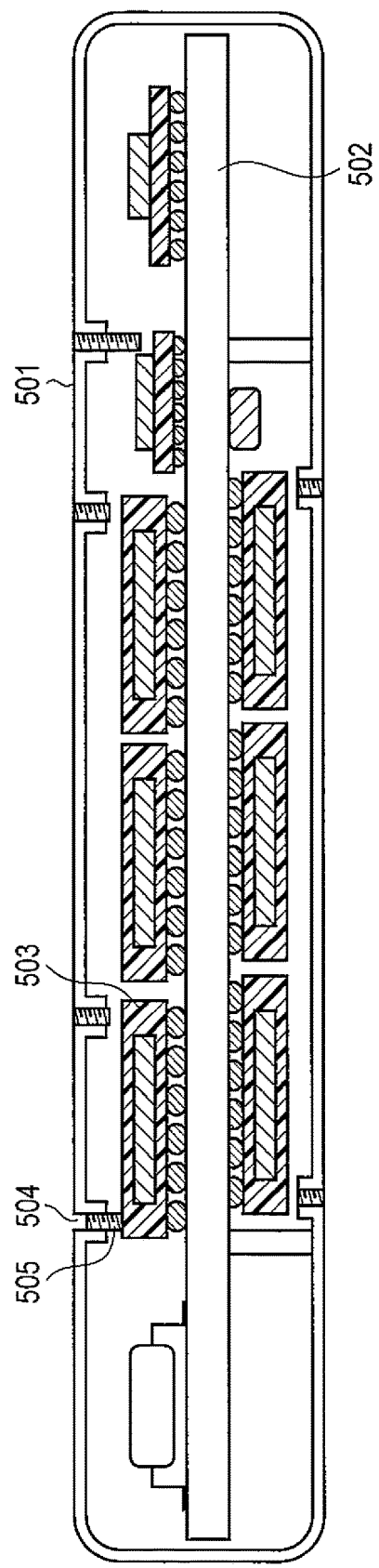
FIG. 5 is a sectional view useful in explaining an example of the loading structure shown in FIG. 3.

Referring to FIG. 5, an example of the loading structure 105 will be described.

The electronic device of this embodiment comprises a casing 501 and a circuit board 502 with an electronic component 503 mounted thereon. As the elements of the loading structure 105, screw holes 504 and push screws 505 are provided. The screw holes 504 are formed in the casing 501 such that they face the junctions of the electronic component 503 provided at the corners thereof. (In the case of FIG. 5, the screw holes 504 and the push screws 505 are not provided for all electronic components. Similarly, in the other embodiments, the elements of the loading structure may not be provided for all electronic components). The push screws 505 are fitted in the respective screw holes 504, and are numbered in an increasing order. For instance, if the determination unit 303 detects damage of the junction located just below the push screw 505 with number "1," it instructs "fastening of the screw with number 1," and the display unit 304 displays "Please fasten the screw with number 1." The information associated with the locations of the screws holes and the screws and their numbering is stored in the database 302.

As described above, in the first embodiment, an appropriate way of applying loads can be presented by measuring the electrical characteristic value of each electronic component and referring to the data that indicates the correlation between the electrical characteristic values of electronic components, the damage of the junctions of the electronic components and the ways of applying loads to the junctions. In this structure, by fastening the push screws to impart loads to the junctions of a damaged electronic component to compress them, electrical connection is restored to enable data to be at least temporarily read from the electronic component and/or written thereto.

(First Modification)

A first modification of the first embodiment is similar to the first embodiment except that in the former, electronic data is copied or moved from an electronic component in accordance with a change in the electrical characteristic value of an electronic component, after a way of applying loads is displayed.

Figure 6:
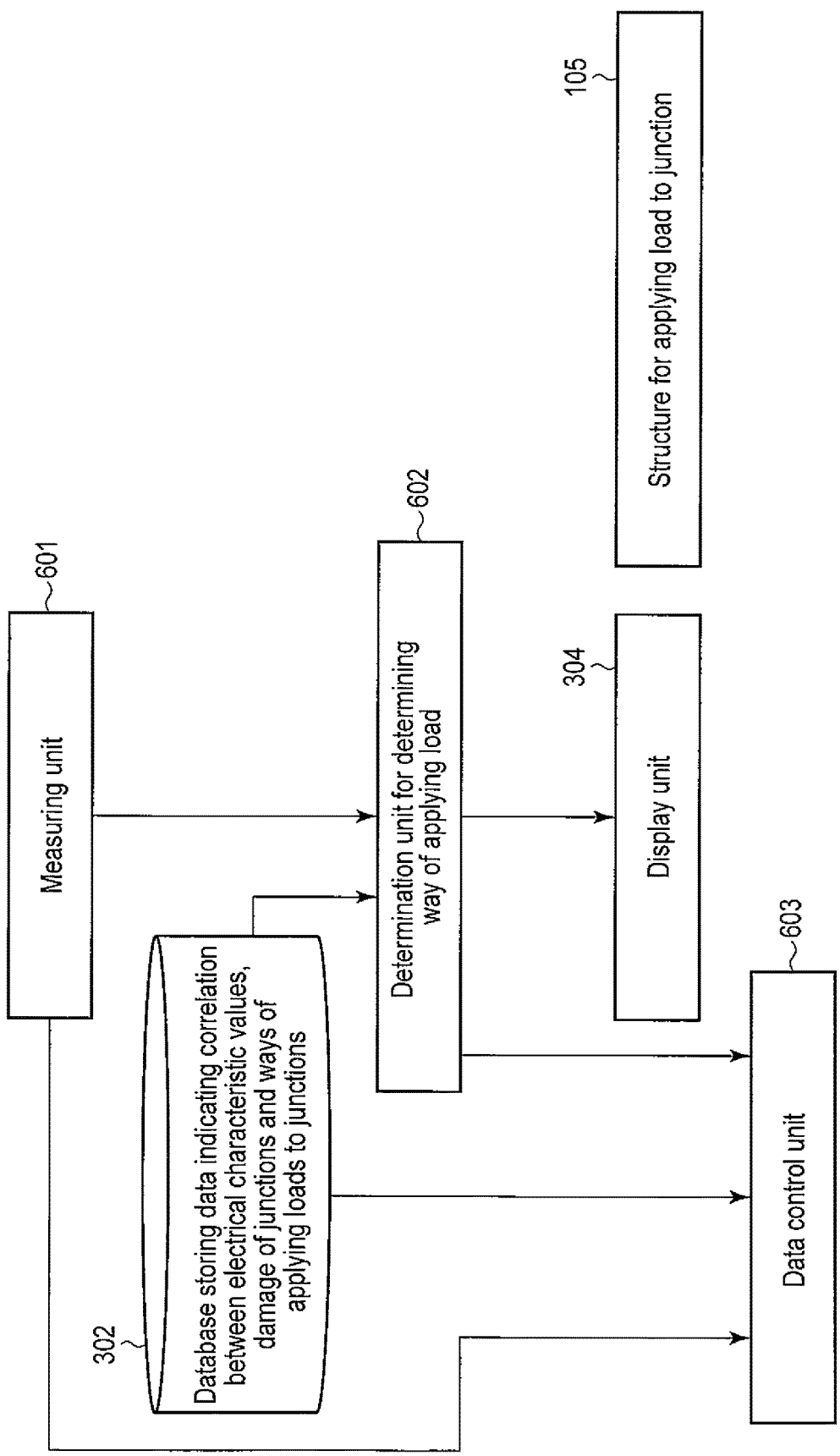
FIG. 6 is a block diagram illustrating an electronic device according to a first modification of the first embodiment.

Referring to FIG. 6, an electronic device according to the first modification of the first embodiment will be described.

The electronic device of the first modification comprises a measuring unit 601, a determination unit 602, a control unit 603, a database 302, a display unit 304 and a loading structure (or loading structures) 105.

The measuring unit 601 measures the electrical characteristic value of an electronic component, and supplies the measurement result to the determination unit 602 and the control unit 603. Further, if a damaged junction is detected, the measuring unit 601 again measures the electrical characteristic value when, for example, a predetermined time period has elapsed after the display unit 304 displays an instruction to apply a load to the junction. Alternatively, the measuring unit 601 may perform the re-measurement based on an instruction from a user.

The determination unit 602 refers to the database 302 to detect, based on the measured electrical characteristic value, whether each junction of the electronic component is damaged, thereby determining the junction(s) to which a load needs to be applied. The determination unit 602 supplies the determination result to the control unit 603 and the display unit 304. Further, the determination unit 602 detects whether each junction is damaged, based on the electrical characteristic value re-measured by the measuring unit 601.

If the determination unit 602 determines that the damaged junction is restored at least temporarily after the measuring unit 601 performs the re-measurement, the control unit 603 causes the electronic data stored in the electronic component with the damaged junction to be copied or moved to another electronic component.

Figure 7:
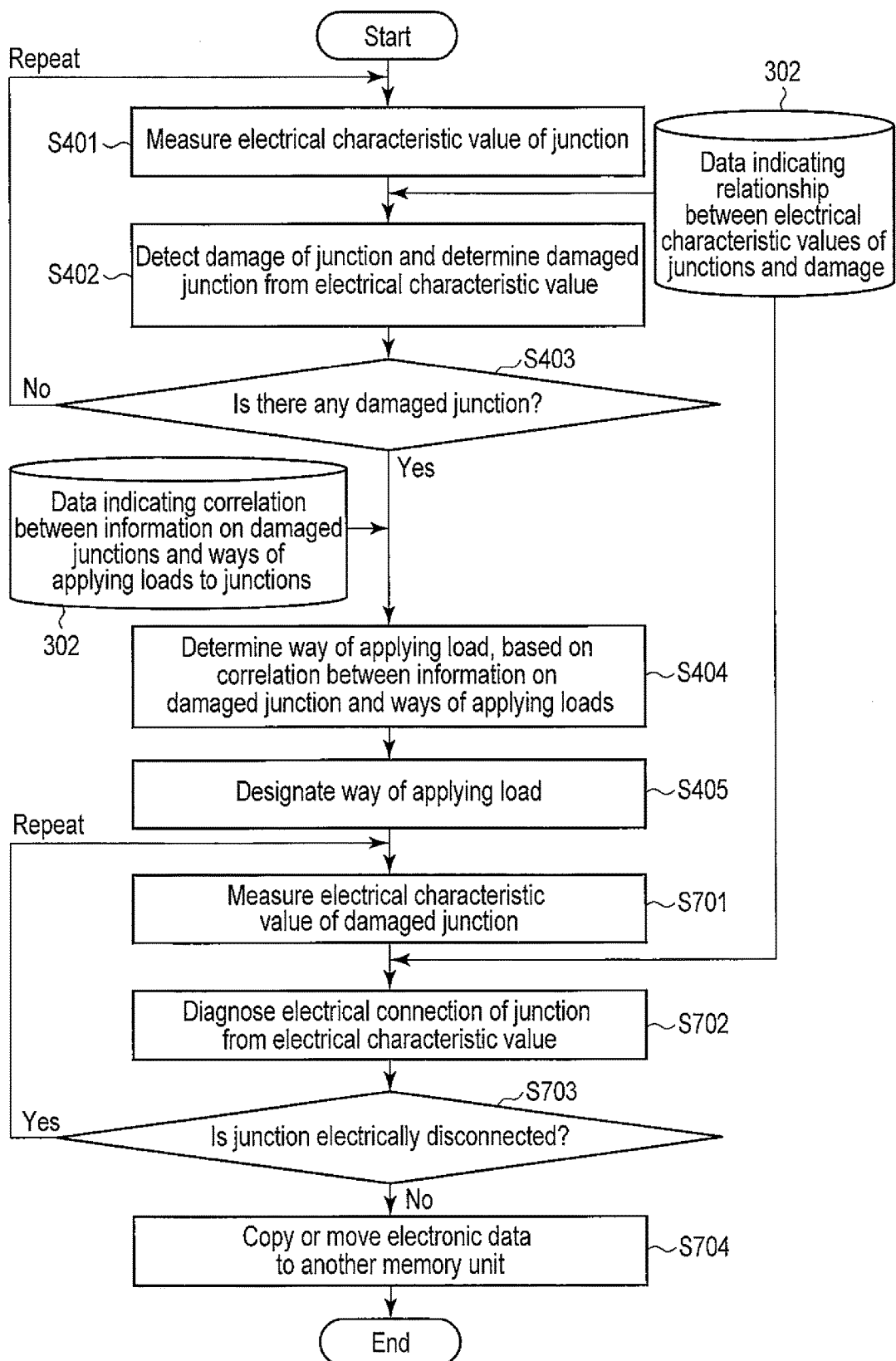
FIG. 7 is a flowchart useful in explaining an operation example of the electronic device of FIG. 6.

Referring then to FIG. 7, an operation example of the electronic device of FIG. 6 will be described.

The process ranging from step S401 to step S405 in FIG. 7 is similar to that performed in the first embodiment.

After a way of applying loads to the damaged junction is instructed (step S405), the measuring unit 601 measures the electrical characteristic value of the damaged junction (step S701), and then the determination unit 602 determines, based on the measured electrical characteristic value, whether there is no more junction in which electrical connection is interrupted (steps S702 and S703). If it is determined that there is no more such junction, the control unit 603 causes the electronic data stored in the electronic component with the damaged junction to be copied or moved to another electronic component (step S704). The determination (at steps S702 and S703) that there is no more junction in which electrical connection is interrupted, which is made based on the electrical characteristic value after the display unit 304 displays a way of applying loads (step S405), indicates that electrical connection is restored in the electronic component by applying a load to the damaged junction.

In addition to the advantage of the first embodiment, the first modification of the first embodiment provides another advantage that electronic data can be more easily and reliably protected, since electronic data is copied or moved to another electronic component immediately after the restoration of the electrical connection.

(Second Modification)

A second modification of the first embodiment is similar to the first embodiment except for the structure of the loading structure 105.

Figure 8:
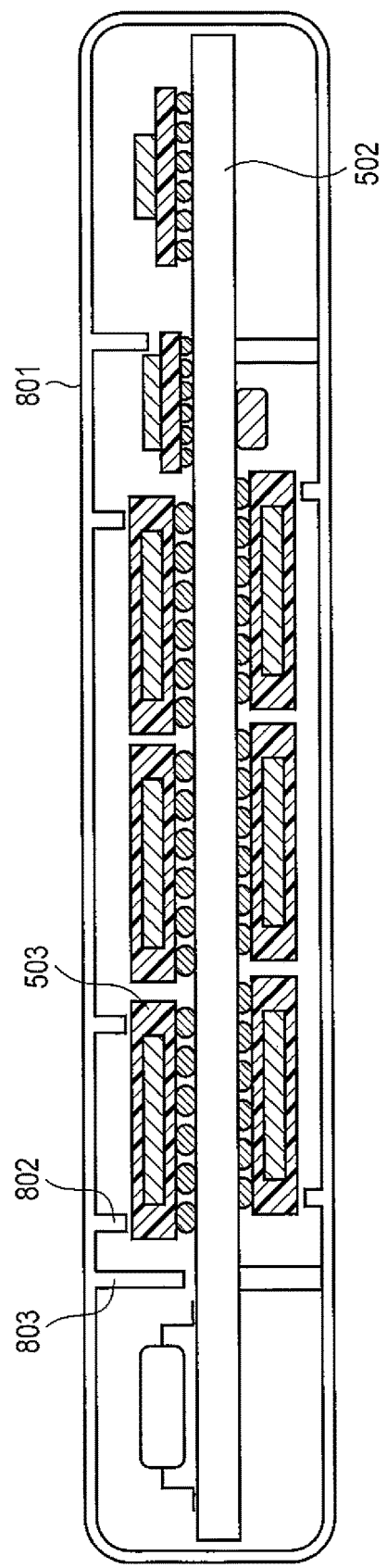
FIG. 8 is a sectional view useful in explaining an example of a loading structure employed in a second modification of the first embodiment.

Referring to FIG. 8, the loading structure of the second modification of the first embodiment will be described.

An electronic device according to the second modification comprises a casing 801, and a circuit board 502 with an electronic component 503 mounted thereon. As the elements of the loading structure, ribs 802 and 803 are provided. The ribs 802 are incorporated in the casing 801 such that they face the junctions of the corners of the electronic component 503 that are estimated high in damage risk, and are numbered in an increasing order. The information associated with the locations of the ribs and their numbering is stored in the database 302. If, for example, the determination unit 303 detects damage of the junction located just below the rib 802 with number "1," it instructs "pressing of the rib with number 1," and the display unit 304 displays "Please press No. 1 position." Further, the ribs 803 prevent deformation of the casing 801 so that excessive load will not be applied to the junctions.

The second modification of the first embodiment provides an advantage of providing a structure that can be easily produced without increasing the required component parts, as well as the advantage of the first embodiment.

(Third Modification)

A third modification of the first embodiment is similar to the first embodiment except for the loading structure 105.

Figure 9:
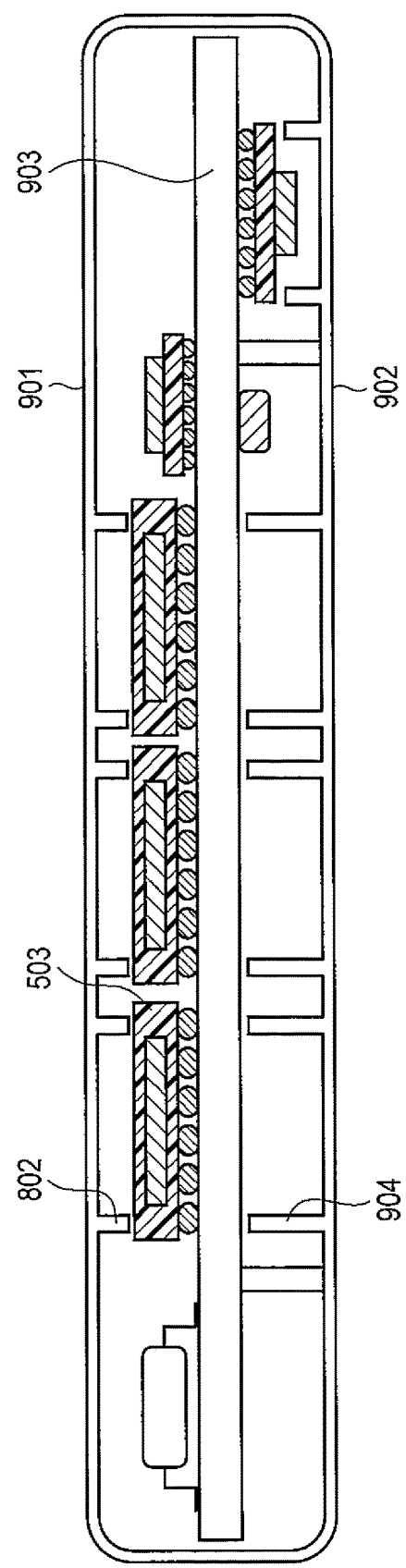
FIG. 9 is a sectional view useful in explaining an example of a loading structure employed in a third modification of the first embodiment.

Referring to FIG. 9, the loading structure of the third modification of the first embodiment will be described.

An electronic device according to the third modification comprises an upper casing 901, a lower casing 902, and a circuit board 903 with an electronic component 503 mounted thereon. As the elements of the loading structure, ribs 802 and 904 are provided. If an electronic component 503 that is estimated high in damage risk is mounted on a circuit board facing the inner surface of the upper casing 901, the ribs 802 are provided on the portions of the upper casing 901 that face the junctions of the corners of the electronic component 503, and the ribs 904 are provided on the portions of the lower casing 902 that face the lower surface of the circuit board and are aligned with the junctions of the corners of the electronic component 503. The ribs 904 on the lower casing 902 are numbered in an increasing order. The information associated with the numbering is stored in the database 302. If, for example, the determination unit 303 detects damage of the junction located just below the rib 904 with number "1," it instructs "pressing of the rib with number 1," and the display unit 304 displays "Please press No. 1 position."

The third modification of the first embodiment can apply loads to the junctions, even when a keyboard, for example, is mounted on the upper casing to make it difficult to apply loads to the junctions from the upper casing side.

Second Embodiment

A second embodiment is similar to the first embodiment except that in the former, the junctions of an electronic component are not discriminated from each other, and if at least one of the junctions is damaged, the electronic component itself is determined to be damaged.

Referring to FIG. 10, an electronic device according to the second embodiment will be described.

A measuring unit 1001 measures one electric characteristic value of each electronic component.

A database 1002 stores data indicating the correlation between the electric characteristic values of electronic components and the states of the electronic components, and data indicating the correlation between the information associated with the states of the electronic components and the ways of applying loads to junctions.

A determination unit 1003 refers to the measurement result of the measuring unit 1001 and the database 1002 to determine which electronic component is damaged. For instance, the determination unit 1003 determines that at least one junction of an electronic component is damaged, by detecting whether electrical connection between the junctions of the electronic component is interrupted.

Figure 11:
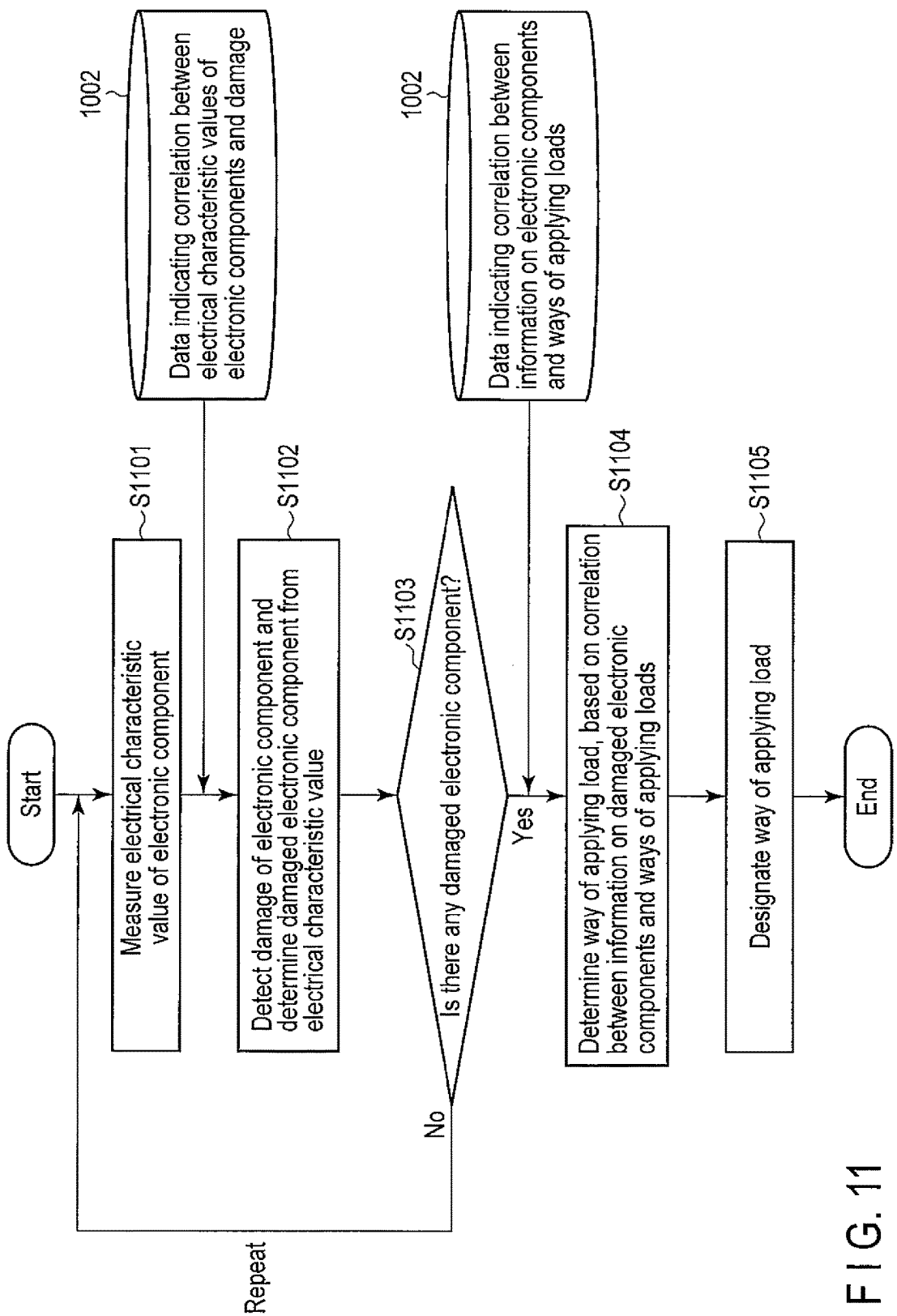
FIG. 11 is a flowchart useful in explaining an operation example of the electronic device shown in FIG. 10.

Referring to FIG. 11, an operation example of the electronic device of FIG. 10 will be described.

The measuring unit 1001 measures the electric characteristic value of each electronic component (step S1101), and detects whether each electronic component is damaged, based on the measured electric characteristic value and referring to the database 1002 storing data indicating the correlation between electric characteristic values and damage (step S1102). The determination unit 1003 determines whether there is a damaged electronic component (step S1103). If it determines that there is a damaged electronic component, it refers to the database 1002 that stores data associated with electronic component information and the ways of applying loads thereto, thereby extracting an appropriate way of applying loads to the damaged electronic component from the information associated therewith (step S1104). The determination unit 1003 informs the presentation unit 104 of the appropriate load application way (step S1105).

Referring then to FIG. 12, the loading structure employed in the second embodiment will be described.

The electronic device of the second embodiment comprises a casing 1201, and a circuit board 502 with an electronic component 503 mounted thereon. Projections 1202 are provided as the elements of the loading structure 105. The projections 1202 are provided on the inner surface of the casing 1201 so that they face the electronic components 503. The projections 1202 each have a size enough to press the entire junction of the corresponding electronic component 503. The projections 1202 are numbered in an increasing order. For instance, if the determination unit 1003 detects damage of the junction located just below the projection with number "1," it instructs "pressing of the projection with number 1," and the display unit 304 displays "Please press the projection with number 1." The information associated with the locations of the projections and their numbering is stored in the database 1002.

In the above-described second embodiment, damage is detected per electronic component, and therefore it is not necessary to discriminate damage of the junctions of each electronic component, which facilitates detection of damage. Further, since damage is detected per electronic component, and since a load is applied to all junctions of the electronic component detected to be damaged, appropriate load application can be achieved even when junctions having a high risk of damage are not detected beforehand.

(First Modification of the Second Embodiment)

A first modification of the second embodiment is similar to the second embodiment except for a structure for applying a load to a junction.

Figure 13:
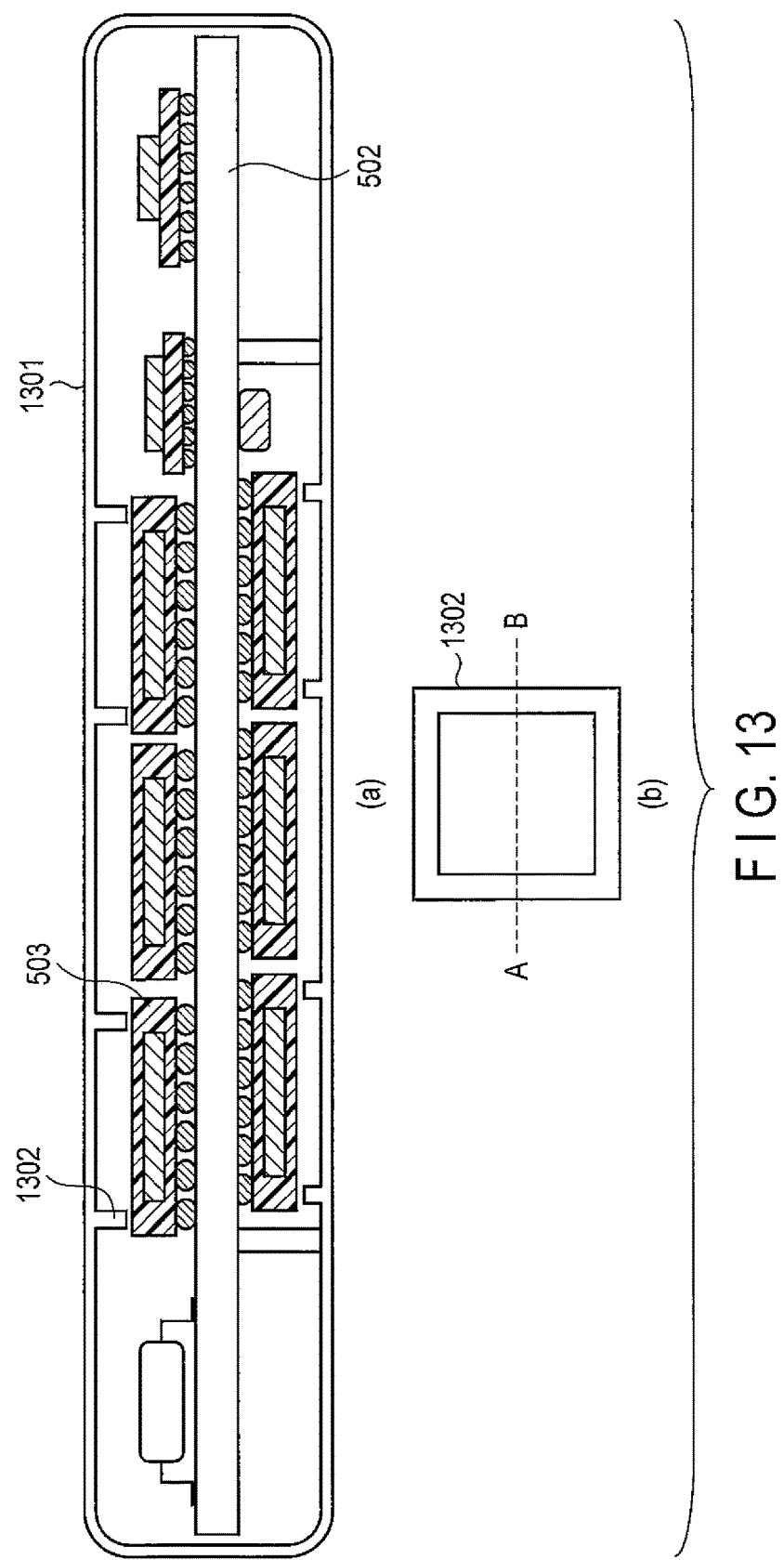
FIG. 13 is a sectional view useful in explaining an example of a loading structure according to a first modification of the second embodiment.

Referring to FIG. 13, a loading structure according to the first modification of the second embodiment will be described.

An electronic device including the loading structure of the first modification of the second embodiment comprises a casing 1301, and a circuit board 502 with an electronic component 503 mounted thereon. As the elements of the loading structure, projections 1302 are provided. The projections 1302 are provided on the inner surface of the casing 1301, and have a square frame shape as shown in (b) of FIG. 13. The section taken along line A-B in (b) of FIG. 13 is shown in (a) of FIG. 13. Namely, as shown in (a) of FIG. 13, each projection 1302 extends from the casing 1301 toward the junctions provided on the outermost periphery of the corresponding electronic component 503. The projections 1302 are numbered in an increasing order. If, for example, the determination unit 1003 detects damage of a junction located just below the projection 1302 with number "1," it instructs "pressing of the projection with number 1," and the display unit 304 displays "Please press No. 1 position." The information associated with the locations of the projections and their numbering is stored in the database 302.

In the first modification of the second embodiment, since loads are applied to the outermost junctions of the electronic components, which have a higher damage risk than the other junctions, it is not necessary to determine which junction is damaged, as in the second embodiment. Further, since a load is applied to the portion estimated to have a higher risk of damage than in the second embodiment, it can reliably be applied to a damaged junction.

(Second Modification)

A second modification of the second embodiment is similar to the first modification of the second embodiment except for the loading structure 105.

Referring to FIG. 14, the loading structure of the second modification of the second embodiment will be described.

An electronic device according to the second modification of the second embodiment comprises a casing 1401, and a circuit board 502 with an electronic component 503 mounted thereon. As the elements of the loading structure, projections 1302 are provided.

In the second modification of the second embodiment, the projections 1302 extend from the casing 1401 toward the junctions provided on the outermost periphery of the corresponding electronic component 503, and have a square frame shape. The projections 1302 are numbered in an increasing order. The information associated with the locations of the projections and their numbering is stored in the database 1002. Further, a spacer 1402 is provided between the casing 1401 and an electronic component mounting surface to deform the casing 1401, whereby a load is applied to the junctions provided on the outermost periphery of an electronic component via the corresponding projection 1302. Further, the spacer 1402 may be adhered to the casing 1401 at a position at which a load is applied to the junctions provided on the outermost periphery of an electronic component.

In the second modification of the second embodiment, since the deformation of the casing is maintained by the spacer 1402, the state in which a load is applied to a damaged junction to restore electrical connection is reliably and easily maintained. Furthermore, since the spacer 1402 keeps the amount of deformation of the casing 1401 constant, it can apply a constant appropriate load regardless of variations in pressing force between individual workers, if it is designed to an appropriate height.

Third Embodiment

A third embodiment is similar to the first embodiment except that in the former, a way of applying loads is determined based on the measured value of state of an electronic component.

Figure 15:
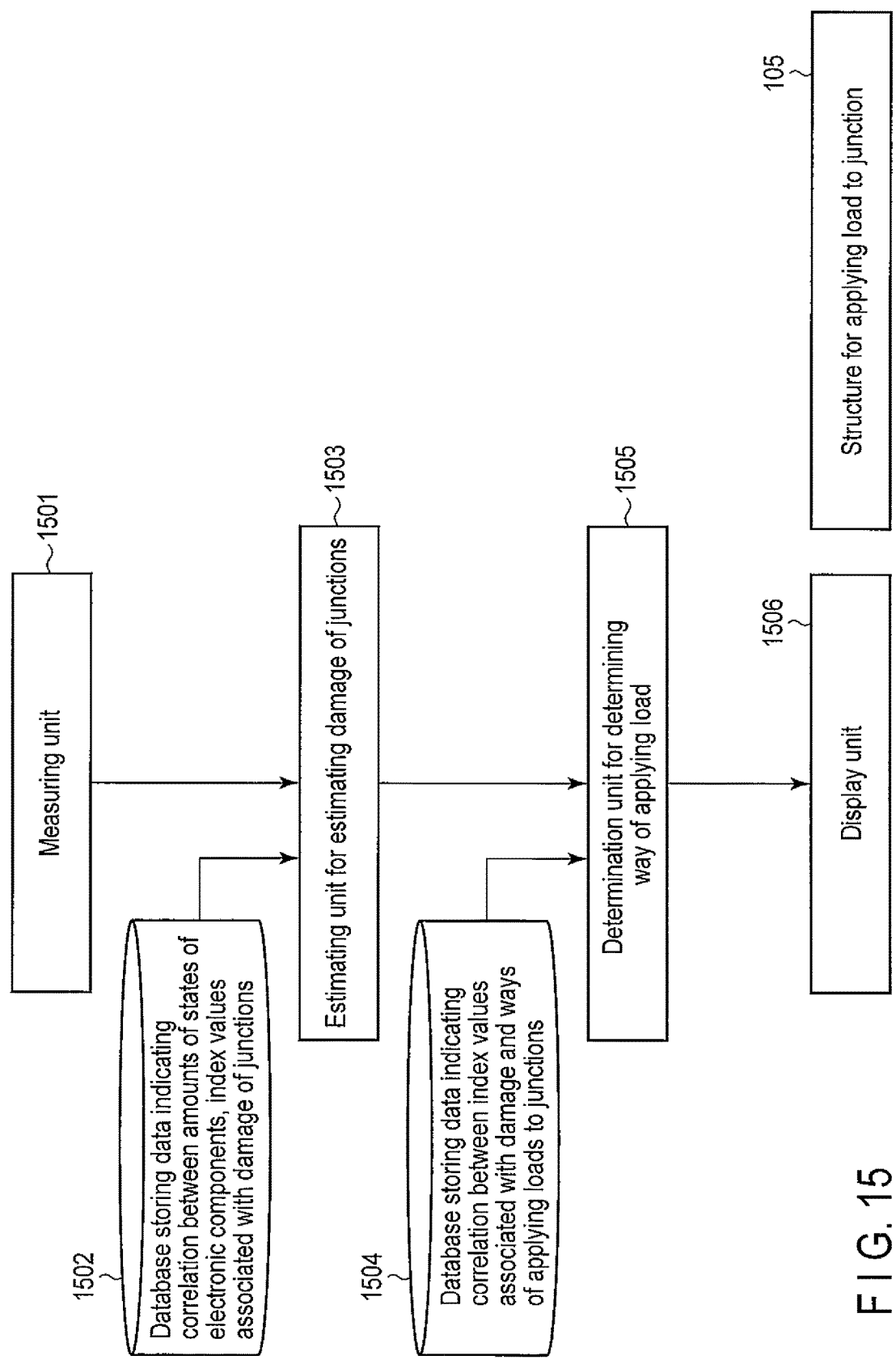
FIG. 15 is a block diagram illustrating an electronic device according to a third embodiment.

Referring to FIG. 15, an electronic device according to the third embodiment will be described.

The electronic device of the third embodiment comprises a measuring unit 1501, a database 1502, a damage estimating unit 1503, a database 1504, a determination unit 1505, a display unit 1506 and a loading structure 105.

The measuring unit 1501 measures the value of state of an electronic component. In this embodiment, the value of state is, for example, a physical amount (e.g., temperature, strain, stress or acceleration) associated with the electronic component. The measuring unit 1501 may measure the physical amount of a board or a casing, instead of the electronic component, and may use it as an approximate value.

The database 1502 stores data indicating the correlation between the values of state of electronic components and the index values associated with damage of junctions.

Referring to the database 1502, the damage estimating unit 1503 estimates the index value associated with damage of a junction of an electronic component, based on the value of state of the electronic component.

The database 1504 stores data indicating the correlation between the index values associated with damage of the junctions and the ways of applying loads to the junctions.

Referring to the database 1504, the determination unit 1505 determines a way of applying loads from the estimated index value associated with the damage.

The display unit 1506 presents the determined way of applying loads.

The index value associated with damage (which will hereinafter be also referred to as a "damage index value") will now be described. In general, whenever an electronic device is used, the power supply is turned on, and whenever the use of the electronic device is finished, the power supply is turned off. Such repetition of ON and OFF of the power supply causes generation of thermal stress in the electronic components mounted in the electronic device. Further, when the electronic device is dropped, vibration is exerted on the electronic components of the electronic device (at this time, abrupt acceleration occurs to thereby cause stress in the electronic components). The thermal stress or vibration occurring in the electronic components may well damage the components or adversely influence the duration of life of the electronic device. The data obtained by expressing this phenomenon in terms of index is set as an index associated with damage. For instance, a life due to damage, a damage value, a function based on the life due to damage, a function based on the damage value, etc., are used as indexes associated with damage. The damage value can be defined, for example, as follows: The damage value obtained when one cycle of a repetition load is applied is expressed as the inverse number of the life cycle number obtained by applying the same repetition load. Further, the damage value obtained when load is repeatedly applied to a junction is the accumulation of values of damage that occurs in respective cycles. When the accumulated damage value reaches 1, it indicates that the junction is damaged.

The database 1502 stores data indicating the correlation between the values of state of the electronic components and the index values associated with damage of the junctions. Assuming, for example, that the strain range Δε of a junction of an electronic component is set as the value of state of the electronic component, and the index value associated with damage of the junction is set as damage value D, the data in the database is a relational expression of Δε and D.

If the junction is a solder junction, the database 1502 stores, for example, data indicating the correlation between strain and the fatigue life of the solder material. Based on the value of state of the electronic component, the measuring unit measures strain that exists in the solder junction. The determination unit refers to the database 1502 to calculate the value associated with the damage of the solder junction, based on the strain measured by the measuring unit, thereby determining a way of applying a load to the solder junction, based on the calculated value.

Figure 16:
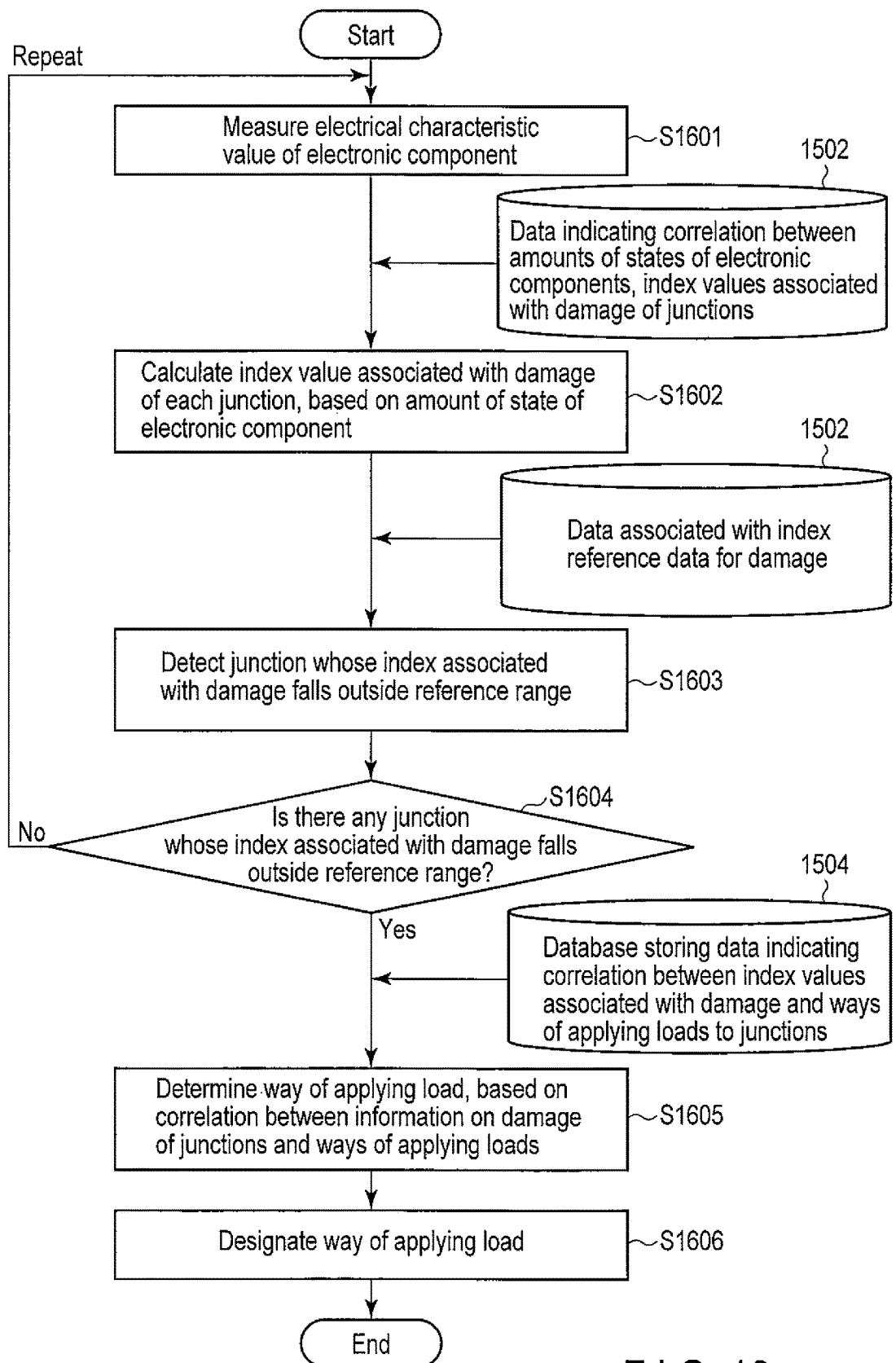
FIG. 16 is a flowchart useful in explaining an operation example of the electronic device shown in FIG. 15.

Referring then to FIG. 16, an operation example of the electronic device shown in FIG. 15 will be described.

The measuring unit 1501 measures the value of state of each electronic component (step S1601). The damage estimating unit 1503 refers to the database 1502 that stores data indicating the correlation between the values of state of electronic components and the index values associated with damage of junctions, thereby deriving an index value associated with damage of a junction from the value of state of each electronic component (step S1602). To apply a load to the junction, the damage estimating unit 1503 refers to the database 1502 that stores index reference data associated with damage of the junctions, thereby detecting a junction (junctions) that corresponds to a damage index value falling outside a reference range and therefore needs to be loaded (step S1603). The damage estimating unit 1503 determines whether there is a junction that corresponds to a damage index value falling outside the reference range (step S1604). If there is a junction that corresponds to a damage index value falling outside the reference range, the determination unit 1505 refers to the database 1504 that stores data indicating the correlation between the index values associated with damage of the junctions and the ways of applying loads to the junctions, thereby deriving a way of applying loads to the junctions (step S1605). The display unit 1506 presents the determined load-applying way (step S1606).

In the third embodiment, since loads are applied when damage is predicted, i.e., before damage is actually detected, reliable data protection can be realized.

Fourth Embodiment

A fourth embodiment is similar to the first embodiment except that in the former, a way of applying loads is determined based on the measured value of state of each electronic component.

Referring to FIG. 17, an electronic device according to the fourth embodiment will be described.

The electronic device of the fourth embodiment comprises a measuring unit 1701, a database 1702, a data estimating unit 1703, a database 1704, a determination unit 1705, and a display unit 1506.

The measuring unit 1701 obtains, by measurement, information associated with data rewriting of each electronic component. For instance, the measuring unit 1701 obtains, by measurement, information associated with the number of times of data rewriting of each electronic component, and associated with data rewriting errors.

The database 1702 stores data indicating the correlation between the information associated with data rewriting of electronic components and information associated with damage of the junctions of the electronic components.

Referring to the database 1702, the damage estimating unit 1703 estimates damage of each junction, based on the obtained data rewriting information.

The database 1704 stores data indicating the correlation between information associated with damaged junctions and the ways of applying loads thereto.

Referring to the database 1704, the determination unit 1705 determines a way of applying loads, based on the obtained data rewriting information.

Referring to FIG. 18, an operation example of the electronic device shown in FIG. 17 will be described.

The measuring unit 1701 obtains, by measurement, information associated with the number of times of data rewriting of each electronic component, and associated with data rewriting errors (steps S1801 and S1802). The damage estimating unit 1703 refers to the database 1702 that stores data indicating the correlation between the information associated with data rewriting of electronic components and information associated with damage of the junctions of the electronic components, thereby detecting a damaged junction (junctions) from the information associated with the number of times of data rewriting of each electronic component and data rewriting errors (step S1803). The damage estimating unit 1703 determines whether there is a damaged junction (junctions) (step S1804). If it is determined that there is a damaged junction (junctions), the determination unit 1705 determines a way of applying loads, referring to the database 1704 that stores data indicating the correlation between information associated with damaged junctions and the ways of applying loads thereto (step S1805), and the display unit 1506 presents the determined load-applying way (step S1606).

Since the fourth embodiment utilizes usually obtained data on electronic component rewriting, it can more easily be applied to electronic devices.

For instance, the embodiments are applicable to semiconductor packages with semiconductor chips mounted thereon, and to chip-type passive components such as resistors, capacitors, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising a circuit board with an electronic component mounted thereon, comprising:
   a measuring unit configured to measure a first value of state of the electronic component;

a first database configured to store data indicating a first correlation between second values of states of the electronic component, information associated with states of a junction of the electronic component and the circuit board, and a plurality of non-thermal ways of applying a first load to the junction to compress the junction between the electronic component and the circuit board, the first correlation between values being one of the values;

a determination unit configured to determine one of the non-thermal ways of applying the first load to the junction, based on the value of state of the electronic component measured by the measuring unit, and referring to the first database; and a presentation unit presents the determined way of applying the first load to the junction, wherein the determined first load is applied to the junction, and the one of the non-thermal ways of applying the first load is at least one selected from the group consisting of (a) fastening a screw along a hole with threads formed in a casing of the electronic component, (b) pressing a rib incorporated in the casing, and (c) pressing a projection provided on an inner surface of the casing, to impart the determined first load to the junction.

2. The device according to claim 1, wherein the value of state of the electronic component is one of a voltage value of the junction, a current value of the junction, and an electrical resistance of the junction.

3. The device according to claim 1, wherein the information associated with the states of the junction includes concerns of damage of the junction.

4. The device according to claim 1, wherein
the information associated with the states of the junction including concerns of damage of the junction; and
the determination unit calculates a third value associated with damage of the junction based on the first value of state of the electronic component, and determines the one of the non-thermal ways of applying the first load to the junction, based on the third value associated with the damage of the junction.

5. The device according to claim 4, wherein the first value of state of the electronic component is at least one of a temperature, stress, strain, and acceleration.

6. The device according to claim 5, further comprising a second database storing data indicating a second correlation between the strain and a fatigue life of a solder material, wherein
the junction is a solder junction;
the measuring unit measures strain that occurs in the solder junction, based on the first value of state of the electronic component;
the determination unit calculates a fourth value associated with damage of the solder junction, based on the strain measured by the measuring unit, and referring to the second database, and determines a way of applying a second load to the solder junction, based on the fourth value calculated by the determination unit.

7. The device according to claim 1, wherein the first value of state of the electronic component corresponds to information associated with data rewriting of the electronic component.

8. The device according to claim 7, wherein the information associated with the data rewriting of the electronic component comprises information associated with number of times of data rewriting of the electronic component, and information associated with a rewriting error of the electronic component.

9. The device according to claim 1, further comprising a control unit configured to copy or move electronic data on the electronic component to a storage in accordance with the first value of state of the electronic component measured by the measuring unit, after the presentation unit presents the determined one of the non-thermal ways of applying the first load to the junction.

10. The device according to claim 1, further comprising a structure configured to apply the first load to the junction, wherein the structure comprises the hole with threads formed in the casing of the electronic component at a location above the junction.

* * * * *